United States Patent [19]
O'Donley

[11] Patent Number: 5,402,006
[45] Date of Patent: Mar. 28, 1995

[54] SEMICONDUCTOR DEVICE WITH ENHANCED ADHESION BETWEEN HEAT SPREADER AND LEADS AND PLASTIC MOLD COMPOUND

[75] Inventor: Bobby O'Donley, Sherman, Tex.

[73] Assignee: Texas Instruments Incorporated, Dallas, Tex.

[21] Appl. No.: 973,894

[22] Filed: Nov. 10, 1992

[51] Int. Cl.⁶ .............. H01L 23/28; H01L 23/48; H01L 29/44; H01L 29/52
[52] U.S. Cl. .............. 257/796; 257/43; 257/675; 257/706; 257/712; 257/717; 257/753
[58] Field of Search ............ 257/43, 706, 720, 704, 257/712, 675, 796, 717, 753; 437/902

[56] References Cited
U.S. PATENT DOCUMENTS

| | | | |
|---|---|---|---|
| 3,469,017 | 9/1969 | Starger | 174/52 |
| 3,783,347 | 1/1974 | Vladik . | |
| 3,790,870 | 2/1974 | Mitchell | 257/43 |
| 3,829,598 | 8/1974 | Darnell | 257/717 |
| 3,902,148 | 8/1975 | Drees et al. . | |
| 4,129,243 | 12/1978 | Cusano et al. | 228/122 |
| 4,159,221 | 6/1979 | Schuessler | 156/285 |
| 4,189,331 | 2/1980 | Roy | 148/6.31 |
| 4,256,792 | 3/1981 | Koepke et al. | 257/720 |
| 4,360,702 | 11/1982 | Feng et al. | 136/261 |
| 4,480,262 | 10/1984 | Butt | 357/74 |
| 4,541,005 | 9/1985 | Hunter et al. . | |
| 4,650,922 | 3/1987 | McPherson . | |
| 5,225,710 | 7/1993 | Westerkamp | 257/713 |

OTHER PUBLICATIONS

ASTM (American Society for Testing and Materials) Designation D 2651-79 (Reapproved 1984).
"Standard Practice for Preparation of Metal Surfaces for Adhesvive Bonding", pp. 166-170.

Primary Examiner—Jerome Jackson
Assistant Examiner—T. M. Arroyo
Attorney, Agent, or Firm—W. James Brady, III; Richard L. Donaldson

[57] ABSTRACT

A semiconductor device (10) includes a semiconductor die (18) and a heat spreader (16) adjacent the semiconductor die (18) for carrying heat away from the semiconductor die (18). The heat spreader (16) has a copper core (30) and a cupric oxide coating (32) formed on at least a portion of the core (30). A plastic package (12) is molded onto the semiconductor die (18) and the heat spreader (16) for supporting the semiconductor die (18) and the heat spreader (16). The cupric oxide coating (32) enhances adhesion of the heat spreader (16) to the plastic package (12).

18 Claims, 3 Drawing Sheets

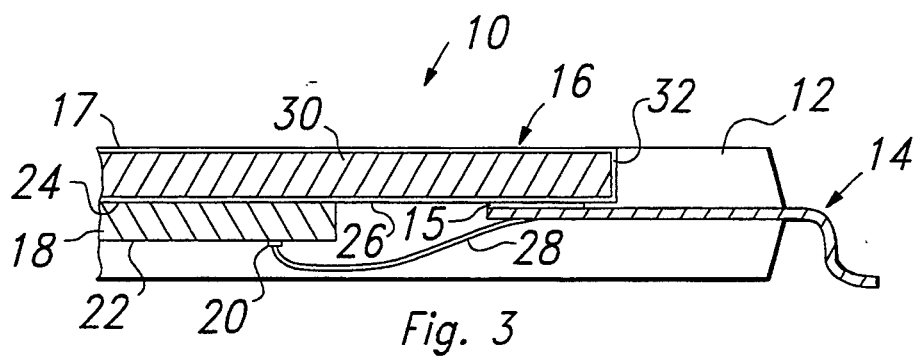
Fig. 3
Fig. 3a
Fig. 4a
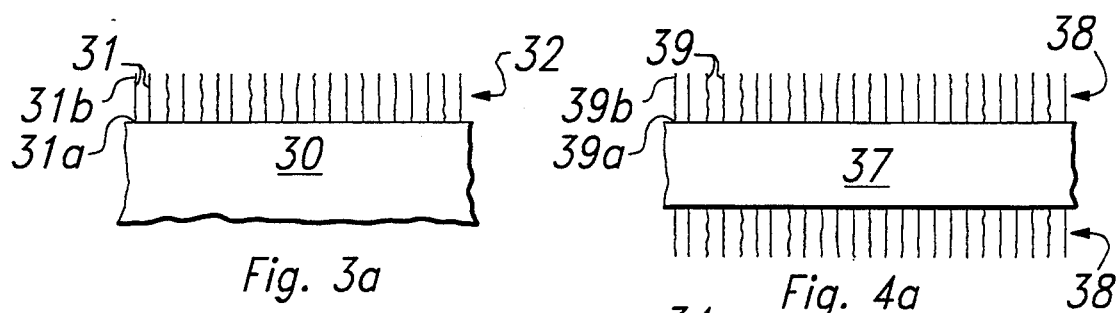
Fig. 4
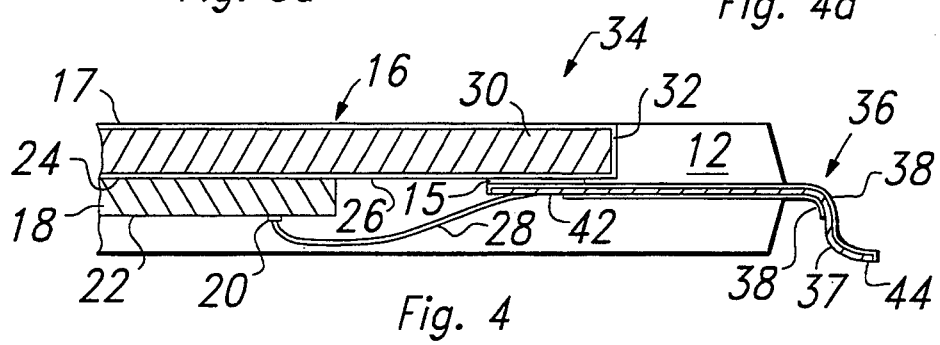
Fig. 5
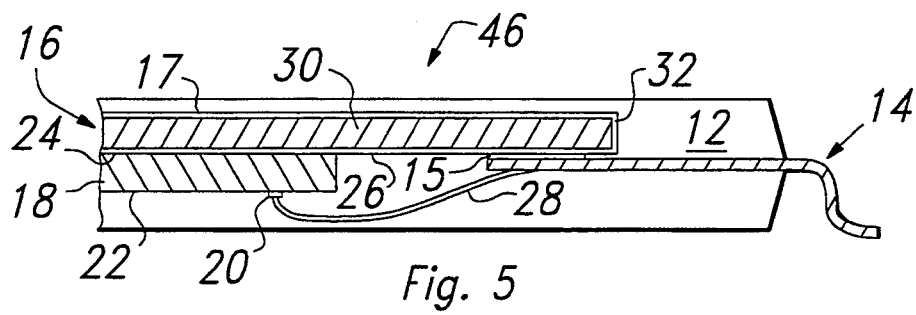
Fig. 6

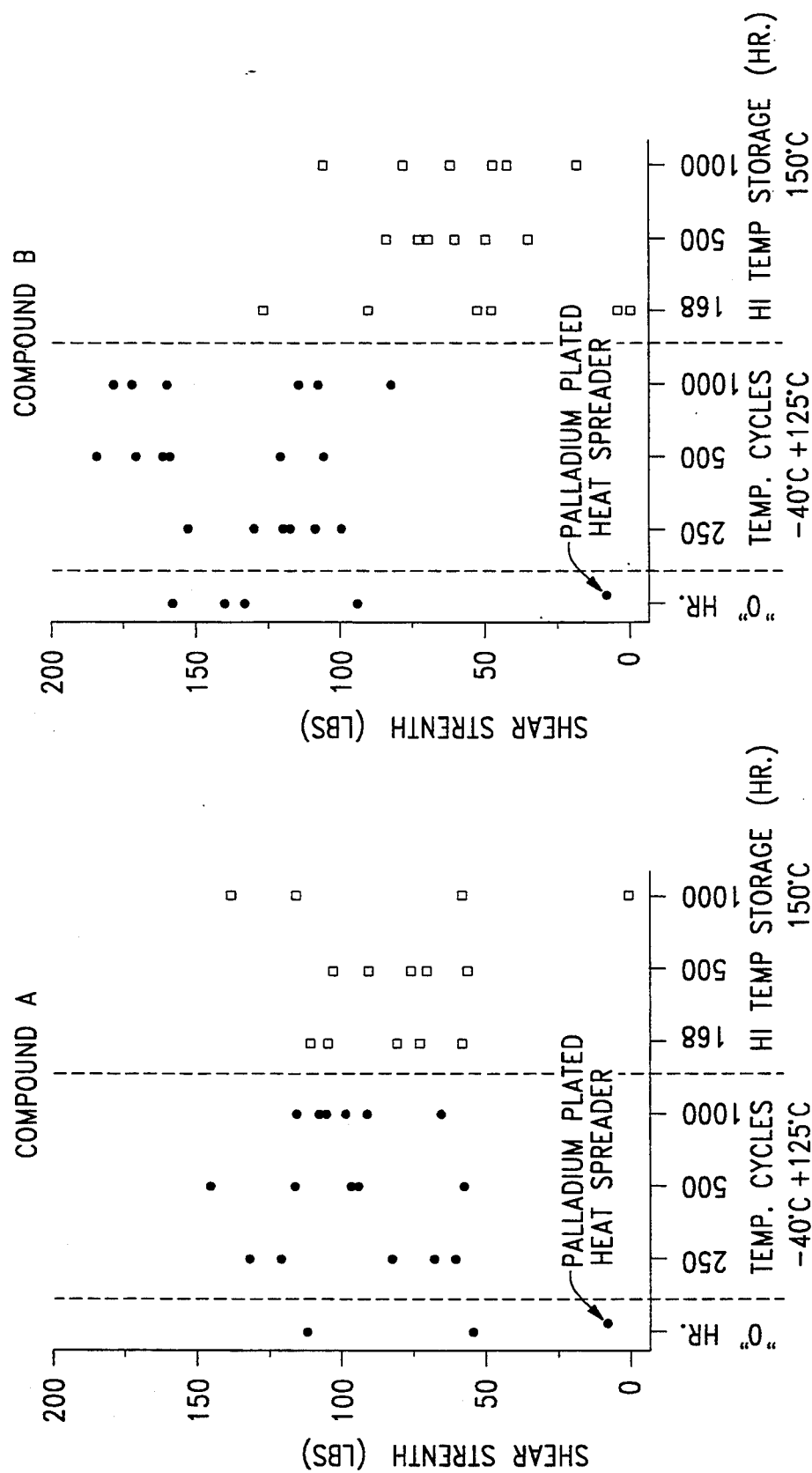

SEMICONDUCTOR DEVICE WITH ENHANCED ADHESION BETWEEN HEAT SPREADER AND LEADS AND PLASTIC MOLD COMPOUND

CROSS-REFERENCE TO RELATED APPLICATIONS

The following coassigned patent application is hereby incorporated herein by reference:

| Serial No. | Filing Date | TI Case No. |
|---|---|---|
| 07/973,903 | 11/10/92 | 17109 |

FIELD OF THE INVENTION

This invention relates generally to semiconductor devices and, more particularly, to packaged semiconductor devices having enhanced adhesion between a heat spreader and leads and a plastic mold compound.

BACKGROUND OF THE INVENTION

Advances in large scale integration are producing integrated circuits with ever diminishing geometries and increasing densities. Associated with the increase in density is an increase in the amount of heat generated by a semiconductor die per square unit of area. The need to effectively dissipate this heat has led to the incorporation of metal heat spreaders in packaged semiconductor devices. Metal heat spreaders typically contact the semiconductor die or a die pad on which the semiconductor die is mounted and serve as a path of low thermal impedance to efficiently conduct the heat generated by the die to the exterior of the packaged device.

In semiconductor devices having an injection-molded plastic package, the metal heat spreader may be either entirely encapsulated or may be only partially encapsulated so that a surface of the heat spreader is exposed. A mechanical lock is often used in molded plastic packaged devices to help secure the metal heat spreader to the plastic mold compound.

SUMMARY OF THE INVENTION

It has been discovered that in molded plastic packages, the bond between a metal heat spreader and the encapsulating plastic is relatively weak. The inability to secure a strong bond can result in the production of microscopic voids or gaps along the bond line between the metal and plastic during thermal cycling of the device, reflow soldering of the device to a printed circuit board, or even during normal operation of the device. The presence of such voids substantially increases the probability that moisture or other contaminants will penetrate the package and reach the surface of the semiconductor die causing the device to fail.

The problem is especially acute in high power semiconductor devices in which a surface of the heat spreader must be exposed to provide sufficient heat dissipation. In such devices, a portion of the bond line is exposed to the environment. Any voids along the exposed portion of the bond line would provide easy access for moisture or other contaminants to enter the package.

Accordingly, a need exists for a semiconductor package having enhanced adhesion between a metal heat spreader and a plastic encapsulant.

Generally, and in one form of the invention, a semiconductor device includes a semiconductor die and a heat spreader adjacent the semiconductor die for carrying heat away from the semiconductor die. The heat spreader has a copper core and a cupric oxide coating formed on at least a portion of the core. A plastic package is molded onto the semiconductor die and the heat spreader for supporting the semiconductor die and the heat spreader. The cupric oxide coating enhances adhesion of the heat spreader to the plastic package.

In another form of the invention, a semiconductor device includes a semiconductor die and at least one lead electrically connected to the semiconductor die. The at least one lead has a copper core and a cupric oxide coating formed on a portion of the core. A plastic package is molded onto the semiconductor die and the at least one lead for supporting the semiconductor die and the at least one lead with the at least one lead extending from the plastic package. The cupric oxide coating enhances adhesion of the at least one lead to the plastic package.

In another form of the invention, a semiconductor device includes a semiconductor die and a heat spreader adjacent the semiconductor die for carrying heat away from the semiconductor die. A plurality of needles are formed on at least a portion of a surface of the heat spreader. Each of the plurality of needles has a first end attached to the surface and a second end spaced from the surface. A plastic package is molded onto the semiconductor die and the heat spreader for supporting the semiconductor die and the heat spreader. The plurality of needles enhance adhesion of the heat spreader to the plastic package.

In another form of the invention, a semiconductor device includes a semiconductor die and at least one lead electrically connected to the semiconductor die. The at least one lead has a plurality of needles formed on a portion of a surface of the at least one lead. Each of the plurality of needles has a first end attached to the portion of the surface of the at least one lead and a second end spaced from the portion of the surface of the at least one lead. A plastic package is molded onto the semiconductor die and the at least one lead for supporting the semiconductor die and the at least one lead with the at least one lead extending from the plastic package. The plurality of needles enhance adhesion of the at least one lead to the plastic package.

An advantage of the invention is that the needles in the cupric oxide coating become embedded in the plastic mold compound during molding of the plastic package thereby greatly enhancing the adhesion between heat spreader or lead and the plastic package.

BRIEF DESCRIPTION OF THE DRAWINGS

In the drawings:

FIG. 3 is an elevation view of the device of FIG. 1 taken along section lines 3—3 of FIG. 1;

FIG. 3a is a greatly magnified view of a portion of a heat spreader according to the first embodiment of the invention;

FIG. 4 is an elevation view in partial cross-section of a packaged semiconductor device according to a second embodiment of the invention;

FIG. 4a is a greatly magnified view of a portion of the leads according to a second embodiment of the invention.

FIG. 5 is an elevation view in partial cross-section of a packaged semiconductor device according to a third embodiment of the invention;

FIG. 6 is an elevation view in partial cross-section of a packaged semiconductor device according to a fourth embodiment of the invention;

FIG. 7 is a graph showing the results of a shear test performed using a first plastic mold compound; and FIG. 8 is a graph showing the results of a shear test performed using a second plastic mold compound.

Corresponding numerals and symbols in the different figures refer to corresponding parts unless otherwise indicated.

DETAILED DESCRIPTION OF PREFERRED EMBODIMENTS

Figure 1:
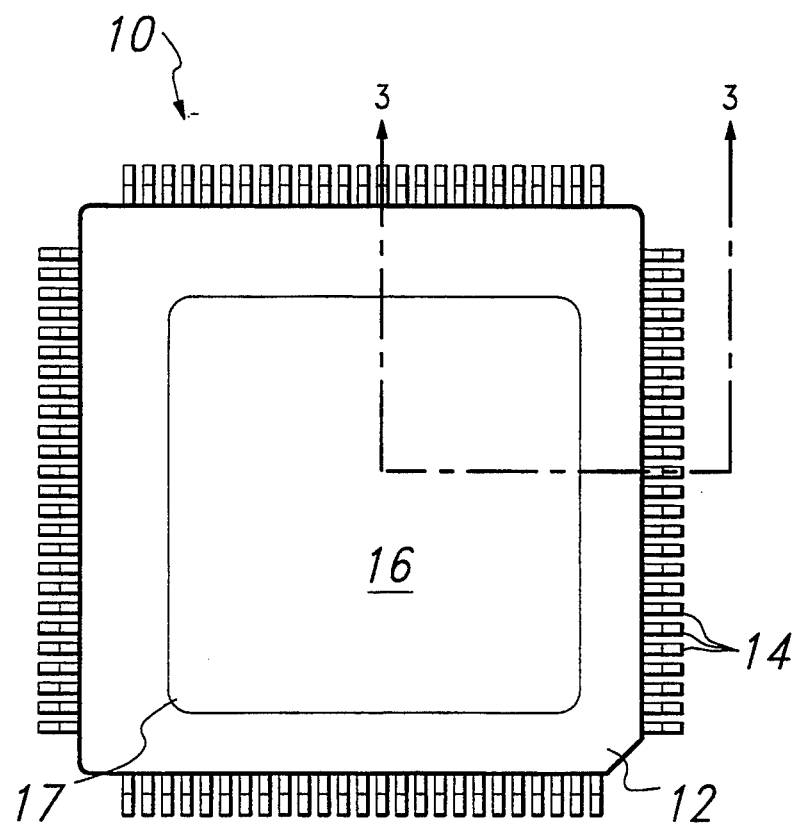
FIG. 1 is a top view of a packaged semiconductor device according to a first embodiment of the invention.

Referring to FIG. 1 of the drawings, a top view of a packaged semiconductor device is illustrated according to one embodiment of the invention. Semiconductor device 10 is a quad flat packaged device and includes an injection-molded flat plastic package 12 formed from any plastic mold compound commonly used in this industry, such as epoxy Novolac. Plastic package 12 provides support and environmental protection for a semiconductor die (element 18 shown in FIG. 3) contained within device 10. Metal leads 14 that are electrically connected to circuitry in the semiconductor die extend from an edge of plastic package 12 for connection to conductors on a printed circuit board or the like.

Device 10 also includes a heat spreader 16 for conducting heat generated by the semiconductor die to the exterior of device 10. Heat spreader 16 is supported by and partially encapsulated by plastic package 12 and has a surface 17 that is exposed to the surrounding environment on the upper surface of device 10 to provide a very efficient thermal path to the exterior of device 10. Air flowing over device 10 aids in dissipating heat carried to exposed surface 17 of heat spreader 16.

Figure 2:
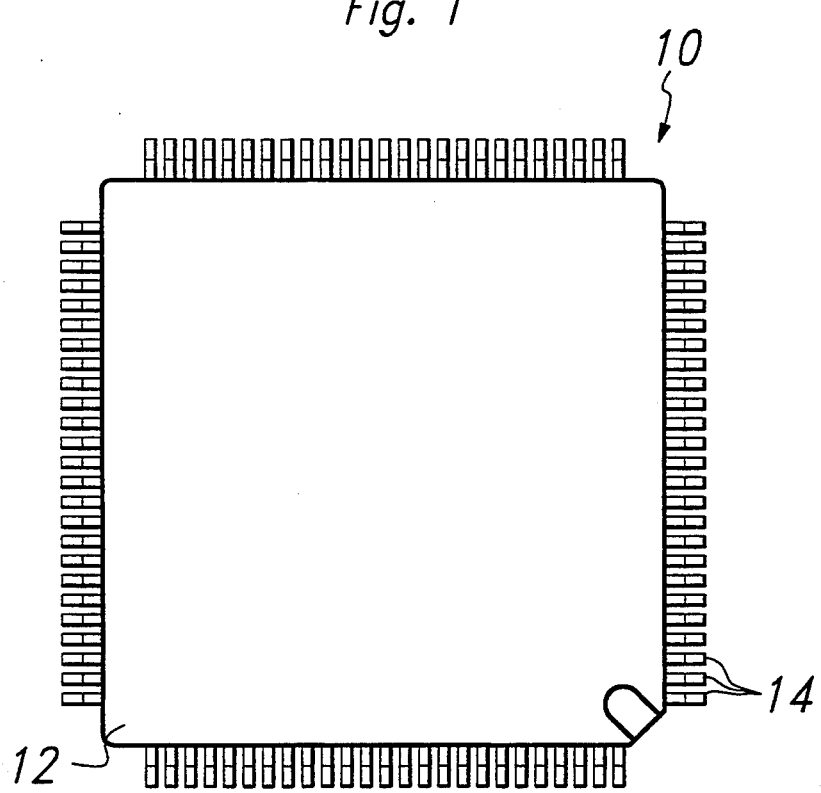
FIG. 2 is a bottom view of the device of FIG. 1.

Plastic package 12 extends across and seals the entire bottom surface of semiconductor device 10 as seen in the bottom view of device 10 in FIG. 2.

Referring to FIG. 3, device 10 includes a semiconductor die 18 having bond pads 20 formed on surface 22. An opposing surface 24 of die 18 is bonded to surface 26 of heat spreader 16 with an adhesive, such as an epoxy, for example. Leads 14 are partially encapsulated by plastic package 12 and are bonded to surface 26 of heat spreader 16 with an adhesive 15, such as a double-sided polyimide adhesive tape. Wires 28 have one end bonded to a lead 14 and another end bonded to a bond pad 20 to electrically connect leads 14 to circuitry in die 18. Wires 24 are completely encapsulated in device 10 by plastic 12.

Heat spreader 16 includes a copper core 30 having a thin cupric oxide coating 32 on its surface. Cupric oxide coating 32 is made up of individual cupric oxide needles 31 having the chemical formula CuO that are attached at one end 31a to copper core 30 and extend from copper core 30 so that the other end 31b of the needles are spaced from the surface of copper core 30 as shown in FIG. 3a. The needles are black in color and are densely packed (on the order of several thousand needles per square inch) giving the heat spreader 16 a totally black appearance. Cupric oxide coating 32 preferably has a thickness in the range of 25-150 microinches. During molding of the plastic mold compound onto the heat spreader 16, the cupric oxide needles become embedded in the plastic mold compound strongly bonding the heat spreader 16 to plastic package 12. Cupric oxide coating 32 thereby greatly enhances the adhesion between heat spreader 16 and plastic package 12. The enhanced adhesion provided by the use of cupric oxide coating 32 reduces device failure rate by helping prevent the formation of voids between heat spreader 16 and plastic package 12. Leads 14 can be bonded to heat spreader 16 without fear of shorting since cupric oxide coating 32 is insulative.

Cupric oxide coating 32 is preferably formed by the method described in ASTM (American Society for Testing and Materials) Designation D 2651-79(Reapproved 1984), page 170, for forming cupric oxide coatings on copper. In accordance with this method, a copper heat spreader is degreased and then immersed in a solution of 10 parts nitric acid to 90 parts water for 30 seconds at room temperature. The heat spreader is then rinsed in running water and immersed immediately in a solution of water and Ebonol C (containing 24 ounces of Ebonol C per gallon of solution) for one to two minutes at 98 degrees Centigrade. Ebonol C is available from Ethone, Inc., New Haven, Conn. The heat spreader is then removed from the solution and rinsed in water. This results in the heat spreader having a copper core 30 with the desired cupric oxide coating 32 on its surface.

While it is preferred that oxide coating 32 is formed over the entire surface of the heat spreader that contacts the plastic mold compound for maximum adhesion, the oxide coating may be formed on only a portion of the surface of the heat spreader that contacts the plastic mold compound. A cupric oxide coating on only a portion of the surface of the heat spreader can be achieved using conventional masking techniques prior to the process steps for forming the oxide or by selective removal of the oxide using conventional abrasive techniques. Although the above technique for forming the cupric oxide coating on copper is preferred, other methods known could also be used.

FIG. 7 is a graph illustrating the results of a shear strength test in which the force required to separate a heat spreader from an epoxy plastic mold compound of Plaskon 760 was measured. Prior to temperature cycling or exposure to high temperatures (0 hr.), a standard palladium plated heat spreader without the cupric oxide coating had a shear strength of approximately 5 lbs. while the remaining heat spreaders with the cupric oxide coating in accordance with the invention had shear strengths of approximately 55 and 105 lbs., respectively. An increase in shear strength of at least an order of magnitude is obtained using the invention. Shear strength tests of heat spreaders formed according to the invention conducted after thermal cycling and high temperature storage show that the increased adhesion is typically maintained even under very severe operating conditions.

FIG. 8 is a graph illustrating the results of a shear strength test in which the force required to separate a heat spreader from an epoxy plastic mold compound of Shinetsu KMC 165-4 was measured. Prior to temperature cycling or exposure to high temperatures (0 hr), a standard palladium plated heat spreader without the cupric oxide coating had a shear strength of approximately 5 lbs. while the remaining heat spreaders with the cupric oxide coating in accordance with the invention had shear strengths ranging from approximately 95 to 160 lbs. Again an increase in shear strength of at least an order of magnitude is obtained using the cupric oxide coating in accordance with the invention. Shear strength tests of heat spreaders formed according to the invention conducted after thermal cycling and high temperature storage show that the increased adhesion is typically maintained even under very severe operating conditions.

FIG. 4 shows a cross-section of a semiconductor device 34 according to a second embodiment of the invention. Device 34 is identical to device 10 of FIGS. 1-3 with the exception that leads 36 are used in place of leads 14. Leads 36 have a copper core 37 with a cupric oxide coating 38 formed over a portion of the copper core 37. Coating 38 is insulative and must therefore be spaced from the end portions 42 and 44 of the copper core 37 that are bonded to wire 28 and a conductor on a printed circuit board, respectively.

Cupric oxide coating 38 is formed by using the method described above to first form a cupric oxide coating over the entire surface of a copper lead frame. The oxide is then removed from portions 42 and 44 of copper core 37 by mechanical abrasion or a chemical etch. Alternatively, portions 42 and 44 of copper core 37 may be masked using conventional masking techniques prior to formation of coating 38 to insure that coating 38 is not formed on portions 42 and 44. The use of cupric oxide coating 38 with leads 34 enhances the adhesion of the leads to plastic mold compound 12. The enhanced adhesion provided by the use of cupric oxide coating 38 reduces device failure rate by helping prevent the formation of voids between leads 34 and plastic package 12. Cupric oxide coating 38 is made up of individual cupric oxide needles 39 having the chemical formula CuO that are attached at one end 39a to copper core 37 and extend from copper core 37 so that the other end 39b of the needles are spaced from the surface of copper core 37 as shown in FIG. 4a.

FIG. 5 shows a cross-section of a semiconductor device 46 according to a third embodiment of the invention. Device 46 is identical to device 10 of FIGS. 1-3 with the exception that plastic package 12 completely encapsulates heat spreader 16. Leads 36 of FIG. 4 may be used in device 46 in place of leads 14, if so desired.

FIG. 6 shows a cross-section of a semiconductor device 48 according to a fourth embodiment of the invention. Device 48 is similar to device 10 of FIGS. 1-3. However, instead of mounting semiconductor die 18 directly to heat spreader 16, die 18 is mounted on a die pad 50 using an adhesive, such as an epoxy. Leads 14 are completely supported by plastic package 12 instead of being bonded to heat spreader 16. Die pad 50 may be bonded to heat spreader 16 with an adhesive, such as an epoxy. Alternatively, die pad 50 may be positioned adjacent heat spreader 16 and held in position by plastic package 12 without the use of an adhesive. Leads 36 of FIG. 4 may be used in device 48 in place of leads 14, if so desired. Plastic package 12 may also completely encapsulate heat spreader 16.

A few preferred embodiments have been described in detail hereinabove. It is to be understood that the scope of the invention also comprehends embodiments different from those described, yet within the scope of the claims.

For example, packages other than quad flat packages may be used; leads that are bonded directly to bond pads on the semiconductor die may be used instead of leads that are wire bonded to bond pads; needle coatings formed from materials other than cupric oxide may be used; and the device may be inverted so that the heat spreader is positioned below the semiconductor die in the device, if so desired.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A semiconductor device, comprising:
   a semiconductor die;
   a heat spreader adjacent said semiconductor die for carrying heat away from said semiconductor die, said heat spreader having a copper core and a cupric oxide coating formed on at least a portion of said core; and
   a plastic package molded onto said semiconductor die and said heat spreader for supporting said semiconductor die and said heat spreader, said cupric oxide coating for enhancing adhesion of said heat spreader to said plastic package.

2. The semiconductor device of claim 1 in which said heat spreader is attached to said semiconductor die.

3. The semiconductor device of claim 1, further comprising a die pad, said semiconductor die attached to said die pad.

4. The semiconductor device of claim 3 in which said heat spreader is bonded to said die pad.

5. The semiconductor device of claim 1 in which said plastic package is molded onto said heat spreader so that a surface of said heat spreader is exposed.

6. The semiconductor device of claim 1 in which said plastic package completely encapsulates said heat spreader.

7. The semiconductor device of claim 1 in which said cupric oxide coating is formed completely over said core.

8. The semiconductor device of claim 1, further comprising at least one lead electrically connected to said semiconductor die, said plastic package encapsulating a portion of said at least one lead.

9. The semiconductor device of claim 8 in which said at least one lead has a copper core with a cupric oxide coating formed over a portion of said copper core, said cupric oxide coating for enhancing adhesion of said at least one lead to said plastic package.

10. The semiconductor device of claim 8, further comprising a wire encapsulated in said plastic package for electrically connecting said at least one lead to said semiconductor die.

11. The semiconductor device of claim 8 in which said at least one lead includes a plurality of leads electrically connected to said semiconductor die, said plastic package encapsulating a portion of each of said plurality of leads.

12. The semiconductor device of claim 1 in which said cupric oxide coating includes a plurality of densely packed cupric oxide needles having a first end attached to said copper core and a second end spaced from said copper core.

13. A semiconductor device, comprising:
   a semiconductor die;
   at least one lead electrically connected to said semiconductor die, said at least one lead having a copper core and a cupric oxide coating formed on a portion of said core; and a plastic package molded onto said semiconductor die and said at least one lead for supporting said semiconductor die and said at least one lead, said at least one lead extending from said plastic package, said cupric oxide coating for enhancing adhesion of said at least one lead to said plastic package.

14. The semiconductor device of claim 13, further comprising a die pad, said semiconductor die attached to said die pad.

15. The semiconductor device of claim 14 further comprising a heat spreader bonded to said die pad.

16. The semiconductor device of claim 13, further comprising a conductive wire encapsulated in said plastic package for electrically connecting said at least one lead to said semiconductor die.

17. The semiconductor device of claim 13 in which said at least one lead includes a plurality of leads electrically connected to said semiconductor die, each of said plurality of leads extending from said plastic package.

18. The semiconductor device of claim 13 in which said cupric oxide coating includes a plurality of densely packed cupric oxide needles having a first end attached to said copper core and a second end spaced from said copper core.

* * * * *